United States Patent [19]
Grodinsky

[11] 3,980,964
[45] Sept. 14, 1976

[54] NOISE REDUCTION CIRCUIT
[76] Inventor: Robert M. Grodinsky, 4448 W. Howard St., Skokie, Ill. 60076
[22] Filed: June 20, 1975
[21] Appl. No.: 588,604

Related U.S. Application Data
[63] Continuation-in-part of Ser. No. 471,194, May 20, 1974, abandoned.

[52] U.S. Cl............................... 330/29; 330/59; 330/136; 330/141; 330/144; 330/149
[51] Int. Cl.² ........................................ H03G 3/30
[58] Field of Search ............... 330/29, 59, 136; 141, 330/144, 149; 333/14; 179/1 P

[56] References Cited
UNITED STATES PATENTS
2,358,045  9/1944  Barney.............................. 333/18 X
3,757,254  9/1973  Takahashi et al..................... 333/14
3,798,562  3/1974  Takahashi et al................. 330/29 X Primary Examiner—James B. Mullins
Attorney, Agent, or Firm—Wallenstein, Spangenberg, Hattis & Strampel

[57] ABSTRACT
A noise reduction circuit for uncompressed and randomly compressed audio signals comprises a variable gain stage providing a gain which varies with the magnitude of a DC control signal fed to a control terminal thereby, an AC to DC converter for generating a DC signal proportional to the amplitude of the AC signal fed thereto and a filter for passing middle and upper frequencies and for eliminating or substantially reducing the low frequencies fed thereto and coupled between the audio signal input and the input to said AC to DC converter.

18 Claims, 9 Drawing Figures

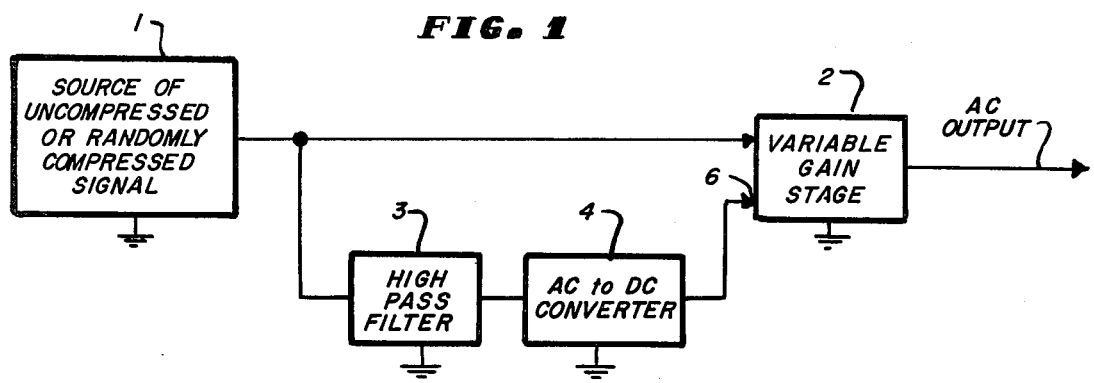
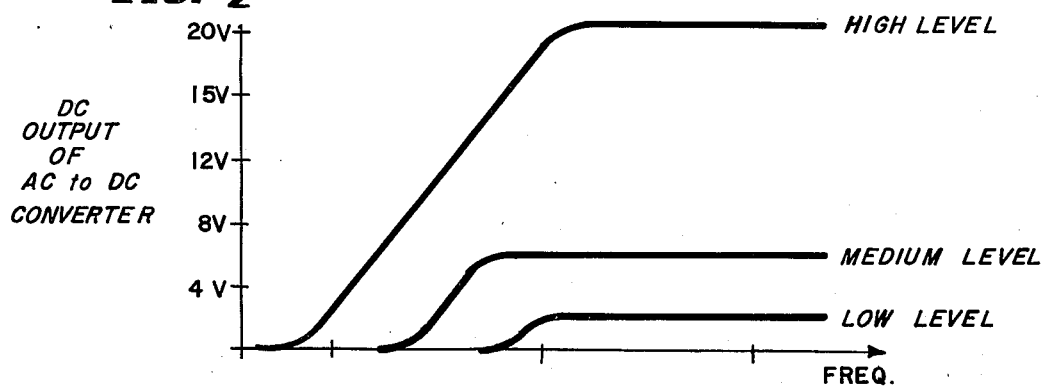
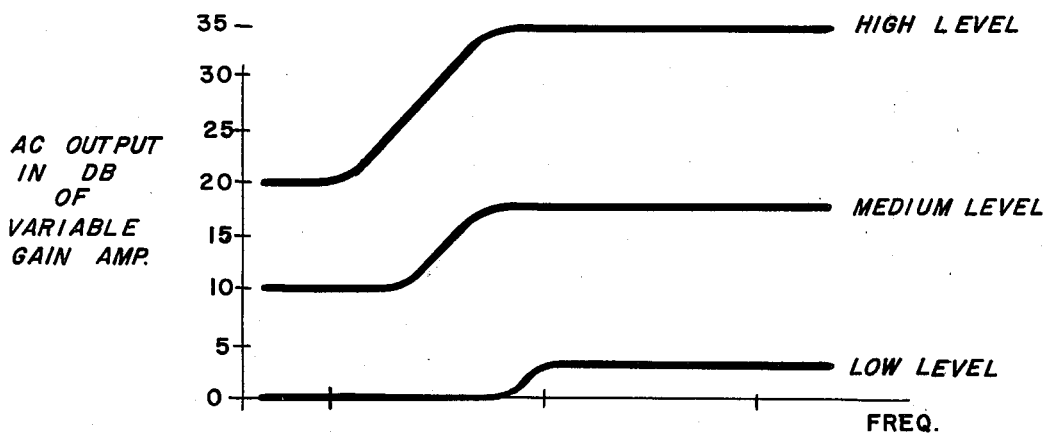
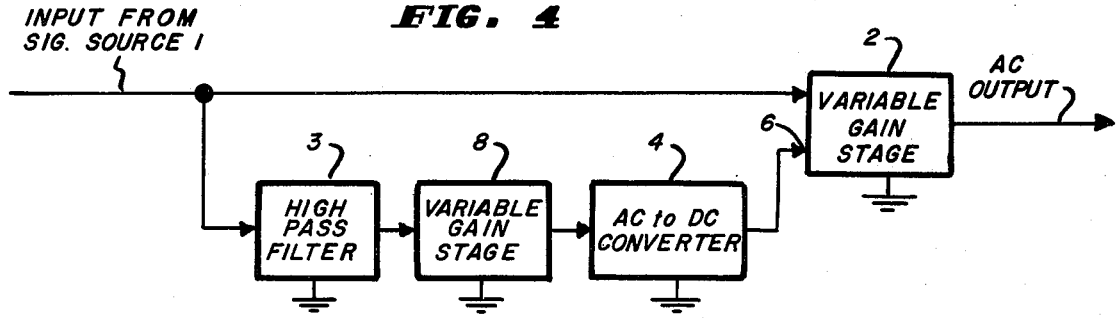

NOISE REDUCTION CIRCUIT

RELATED APPLICATION

This application is a continuation-in-part of U.S. application Ser. No. 471,194, filed May 20, 1974, now abandoned.

BACKGROUND OF THE INVENTION

This invention relates to a circuit for improving the signal to noise ratio of randomly compressed or uncompressed signals.

Improvement in the signal to noise ratio of recorded signals has always been a consideration in recording-reproducing systems. Processing systems which treat the program material both in recording and playback to improve the signal to noise ratio have been used. Such a processing system which works on playback only is more universal since it can be used on any recorded material. In the past, two approaches have been used to obtain noise reduction in the playback of any recorded material. The first technique is to limit the playback bandwidth to that required by the instantaneous program content. This requires sensing the frequency limits of the program and activating high and low pass filters which allow only the useful program content to go unattenuated. In the absence of signal, the bandwidth is reduced to some minimum value which largely attenuates the noise components of the recording medium. This relatively complex system has not been widely used because the cutting in and out of the filters is often noticeable to the listener.

The second approach is to use an expander to increase the dynamic range of the recorded program, which produces a decrease in background noise by effectively reducing the level of the softer passages relative to the higher level passages and thus reducing the residual noise levels which are most noticeable in the softest parts of the program or in the absence of modulation. An expander circuit generally includes a variable gain amplifier whose gain varies with the amplitude of a direct current (DC) control signal fed thereto from the output of an AC to DC converter circuit fed in parallel with the amplifier by the AC input signal. To be satisfactory, the expansion action must be capable of following the dynamic changes in the program levels accurately both on attack and decay. To accomplish this ideally requires a fast response, low ripple AC to DC converter such as described in my U.S. Pat. No. 3,760,255. Even with such a converter, however, certain types of program material can produce undesirable effects known as "pumping". This occurs when a strong low frequency sound causes the expander to increase its gain. The low frequency sound does not mask high frequency hiss and thus as the amplitude of the low sound changes, the level of the hiss is pumped up and down in conjunction with it. If suitable high frequency sounds are also present they will mask the hiss and the pumping effect will not be noticed. Another instance of pumping occurs when an announcer speaks against a background of applause. His voice causes the expander gain to change which causes noticeable level changes in the applause background. To avoid these effects the frequency spectrum has been divided into low frequency and high frequency channels by means of filters with each channel having separate filters, AC to DC converters and variable gain amplifiers. Each is then expanded separately and then the two parts are recombined. This design is not without drawbacks, since the expansion of a sound and its harmonics into separate channels can distort the relative ratios of the various frequencies, and the complexity of the circuit increases the cost of the equipment involved.

SUMMARY OF THE INVENTION

The present invention achieves noise reduction in playback only systems by means of a method of signal expansion which avoids pumping effects without any noticeable distortion and with a much less complex circuit. The circuit contains a non-frequency selective variable gain element which is controlled by a DC voltage derived from an AC to DC converter. The complete program is fed to the variable gain stage, but a low frequency filter which removes or attenuates the low audio frequencies (largely encompassing what is sometimes referred to as the fundamental frequencies of most audio signal programs) is connected between the input of the AC to DC converter and the program source. The DC signal produced is thus representative mainly of only the program content of the intermediate and high audio frequencies which encompasses largely what is sometimes referred to as the harmonics of the fundamental frequencies of most audio signal programs. The instantaneous gain of the variable gain stage at any moment in time is a function of the DC control voltage, which in turn is generated by the AC to DC converter. It has been unexpectedly found that most program material has enough harmonic content to control the expansion of the program level in this way to a desirably modest degree of expansion, such as preferably from 2 to 6 db for each 10 db input change in dynamic range of the input signal. The degree of noise reduction is the same as the increase in dynamic range. All low level noise is reduced without any frequency discrimination, thus acting alike on both hum and hiss in the program background. Since most recorded signals, both discs and pre-recorded tapes, are compressed to a considerable degree the added dynamic range effected by the expansion is usually a benefit toward recreating a realistic sound. Because expansion occurs only when higher frequencies are present, this insures that masking signals are available to cover up noise when the expander gain is increased.

While best results are achieved by the use of a low frequency filter as described in advance of an AC to DC converter as disclosed in my U.S. Pat. No. 3,760,355, where low cost is a major factor, a simpler AC to DC circuit can be used with rectifiers and a ripple filter capacitor in a relatively short time constant circuit which follows the relatively sudden changes in the dynamic range of the signal. The absence of low frequencies removed by the filter makes this possible since the ripple filter capacitor does not have to accommodate low frequencies.

It is also possible to design an expander circuit using as the variable gain element a light sensitive variable resistor such as a photo cell. The resistance of this variable resistor is controlled by the light output of either an incandescent lamp or a light emitting diode. To apply the present invention to such a circuit, a low frequency filter responsive primarily to the harmonic frequencies of musical instrument signal sources (that is responsive substantially at least to the middle audio frequencies) is coupled in the path of the drive signal to the light generating element. Depending on the signal integrating nature of the light generating element, a separate AC to DC converter between the filter and the light generating element may not be needed.

The use of a filter in advance of expansion and/or compressor circuits is old in environments significantly different from that of the present invention, such as in circuits which operate in systems where recorded signals are compressed to a pre-determined degree requiring a complementary expansion circuit and where signal expansion is done on a two channel frequency selective basis, with one channel expanding or compressing high frequency signals and the other channel expanding or compressing low frequency signals, the net result being a complex and relatively costly expansion system which, overall, responds to both high and low frequency signals. Thus, the compression and/or expansion circuits in such patents as U.S. Pat. No. 2,358,045 to Barney and U.S. Pat. No. 3,364,369 to Dreyfus are examples of such systems which are unlike the noise reducing expansion circuit of the present invention. Also, U.S. Pat. No. 3,757,254 to Takahashi et al discloses a closed loop encode-decode recording system using limiters to set the action levels for low level operation only. The function of this system is similar to a Dolby encode-decode system. In the embodiments of FIGS. 3 and 9B of this patent, an AC to DC converter is shown which is non-frequency discriminating, which is the complete antethesis of the present invention. With regard to the FIG. 11 embodiment of this patent, the signal path or variable gain stage is, unlike the present invention, frequency discriminating and requires a complimentary processed input signal to avoid a different sound from the original programmed signal.

FIG. 1 is a block diagram of a noise reduction circuit incorporating a first form of the invention;

FIG. 2 shows curves of the DC output of the AC to DC converter of FIG. 1 for various sine wave input frequencies at low, medium and high level AC input signals;

FIG. 3 shows curves of the output of the variable gain stage shown in FIG. 1 for the various DC converter output signals of FIG. 2;

FIG. 4 is a block diagram of a second form of the invention which operates over a greater input signal dynamic range;

Figure 5:
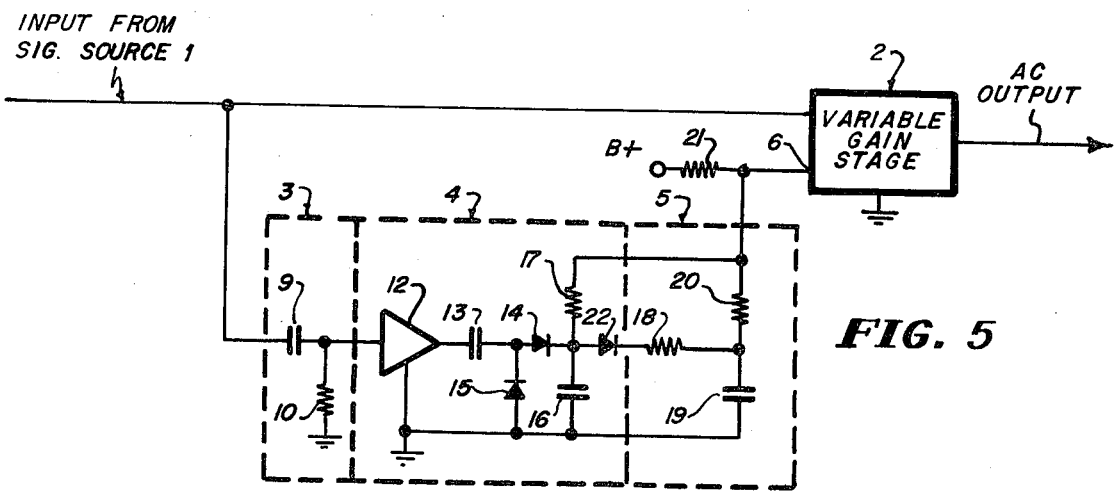
Figure 6:
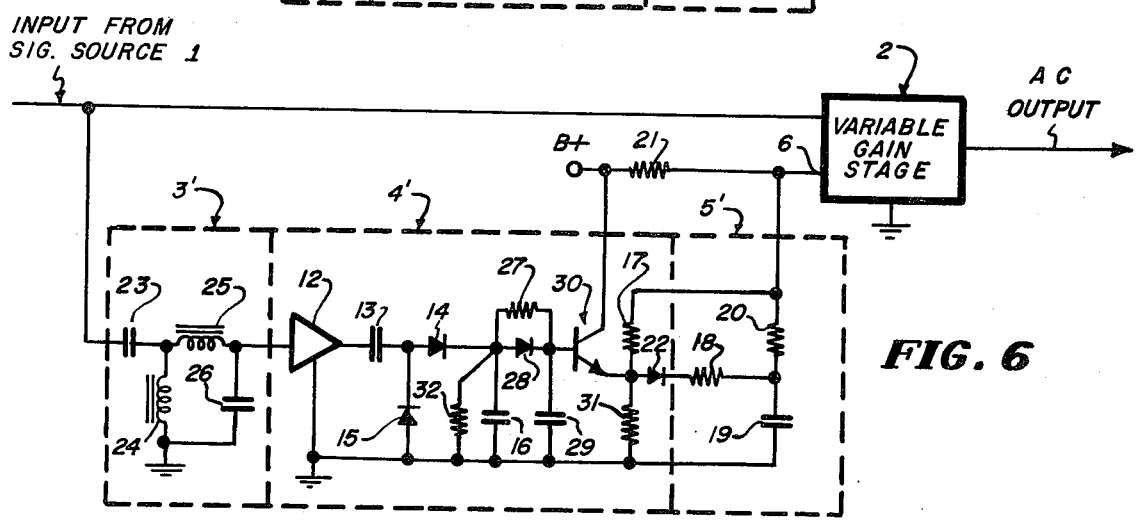
Figure 7:
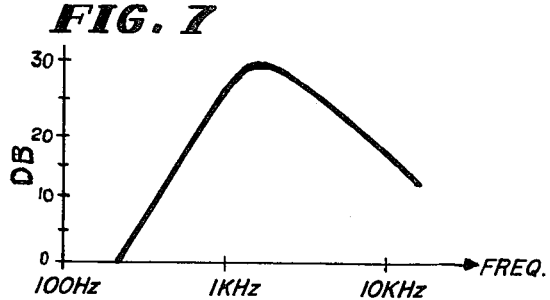
Figure 8:
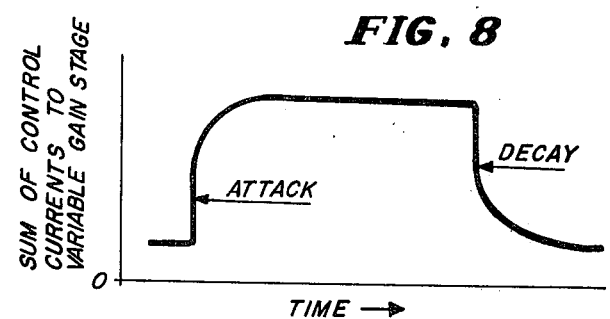

FIG. 5 is a circuit diagram of an exemplary noise reduction circuit of the invention using a relatively simple, inexpensive and effective AC to DC converter made possible by the use of a high pass filter at the input thereto in accordance with the present invention, and further adds to the circuit shown in block form in FIG. 1 an averaging filter to introduce a secondary control over the variable gain amplifier;

FIG. 6 is a circuit diagram of a circuit similar to that shown in FIG. 5 except that the high pass filter has been replaced by a band pass filter and the ripple filter portion of the AC-DC converter has been modified to achieve improved results;

FIG. 7 shown an exemplary response curve of the band pass filter shown in FIG. 6;

FIG. 8 is the resultant curve of the summation of the control currents fed through the control terminal of the variable gain stage of FIG. 6 resulting from a relatively long duration audio signal suddenly applied and suddenly terminated.

Figure 9:
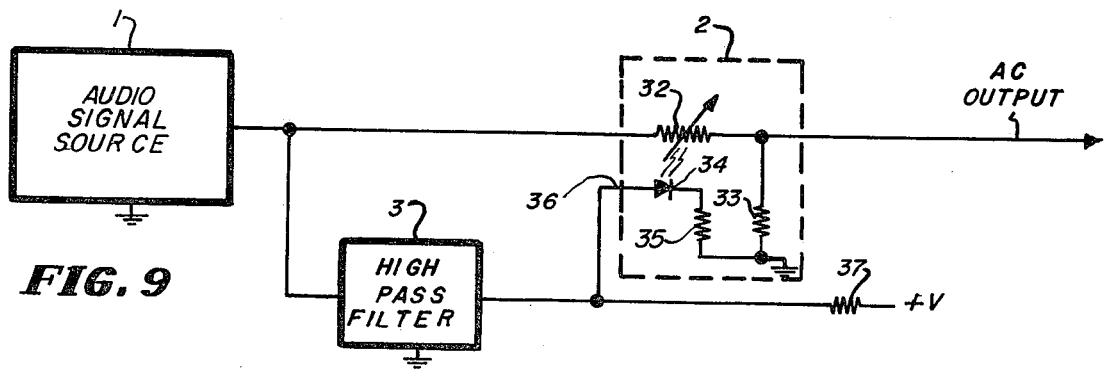

FIG. 9 is a block diagram of a third form of the invention utilizing a photo cell-controlled variable gain stage.

DESCRIPTION OF THE PREFERRED EMBODIMENTS

Referring now to FIG. 1, there is shown one form of the invention comprising a source 1 of an uncompressed or randomly compressed signal connected both to a substantially non-frequency selective variable gain stage 2 and a filter 3. The filter 3 substantially reduces most of the signal frequencies below, for example, approximately 1–1.5 kilohertz and passes without substantial reduction at least the balance of the frequencies which contain most of the energy content of most audio signal program harmonics, which generally encompass the middle audio frequency range (e.g., from 1 to 5 kilohertz). This filtered AC signal is then fed to an AC to DC converter 4 where a DC signal proportional to the magnitude of the filtered AC signal is produced. This DC signal is fed to the gain control input terminal 6 of the variable gain stage 2. When the gain of the variable gain stage 2 increases in response to the value of the DC control signal fed thereto, expansion of the audio signal fed to the input thereof results. Since the lower audio frequencies do not substantially appear at the input to the AC to DC converter 4, the time constant of the capacitive containing portion of the AC to DC converter can be short so that the DC signal is responsive to fast changes in the level of the audio signal, and thus the signal expansion is achieved with a fast attack and short recovery time.

FIG. 2 is a graph of the DC output signal of the AC to DC converter of FIG. 1 for sine wave (non-harmonic) input signals of varying frequency. The response is shown for various levels of AC input signals.

FIG. 3 is a graph of the AC output of the variable gain stage 2 for three levels of sine wave input signals corresponding to the three DC levels of FIG. 2. The fall off in gain at lower frequencies is a result of the loss of appreciable DC output from the AC to DC converter at these frequencies. With a complex program the DC control signal is representative of the harmonics above at least 1 and preferably 1.5 kilohertz and this has been determined to be adequate for expansion of the program. Because the gain of the variable gain stage 2 is at any instant in time a function of the control DC voltage and, in itself, does not discriminate against frequency, the complex audio program signal is unaltered in frequency response. However, the instantaneous gain thereof is a function of the composite effect of the amplitudes of the program frequencies which pass through the filter 3.

As previously indicated, carefully controlled tests involving wide varieties of music and speech programs have unexpectedly revealed that the dynamic control of the program using mostly the harmonics of the audio frequencies are highly effective and without the intrusion effects of pumping and loss of noise masking sounds which occur when a full range of audio signals are used to derive the control signals. Because of the use of a low frequency filter ahead of the AC to DC converter, the circuitry for the AC to DC converter can be less expensive, and the response time affecting components of even the best prior circuits, such as shown in my U.S. Pat. No. 3,760,255, are reduced in value to speed up the attack and decay periods. The circuit of this invention can be used on all available program inputs without the prior encoding of these programs.

It has been found that by using an expander circuit as described in FIG. 1, certain limits apply to the degree of expansion that is effective. Too much expansion results in audible effects in the form of dynamic distortions of the program material. For example, if an expansion rate is used such that a 10db input change results in a 20db output change, the resulting sound is unnatural. If the expansion rate is limited to about a 2–6db expansion for each 10db input change of program, the resulting sound is natural and extraneous background noise is reduced by 6–12db. This modest increase in dynamic range and the improvement in signal to noise level results in sound reproduction which is noticeably superior to that which has not been so expanded. Additionally, since in current practice the dynamic range of most recordings is poor, only 20–35db, the expansion action need only occur over this limited range. With this type of limited dynamic material, it is desirable that the operating range of the expander not greatly exceed the dynamics of the program. Otherwise, the noise reduction action will be excessive and the resulting change in noise levels between absence of program and the presence of low to medium program levels will cause a noticeable change in the noise levels which call attention to the expansion action. Limiting the no signal gain reduction to a maximum of approximately 10–12db avoids this effect. Thus, if a program of 30db range were expanded 3db for each 10db of input, a 39db range would result with 9db of improved signal to noise ratio.

In summary, three advantages accrue from obtaining the control DC signal from the middle and higher frequencies only. First, the time constants for both the attack and decay of the AC to DC converter can be made short so as to follow changes in program level without noticeable lag. Secondly, pumping effects, where with certain types of program material a low frequency will cause gain variations of other higher frequencies, are eliminated. Thirdly, the gain is increased only when frequencies above about 1–1.5 kilohertz are present. This assures that signals are available to mask high frequency hiss.

FIG. 4 is a modification of the circuit of FIG. 1 which shows the addition of a second variable gain stage 8 added between the filter 3 and the AC to DC converter 4. This stage is connected to act as a linear compressor so as to expand the dynamic range of input signals which the AC to DC converter can accept. Accordingly, there is a connection from the DC output of the AC to DC converter 4 to the gain control input of the variable gain stage 8. Thus, if a signal having dynamic range of 80db is compressed two to one, the AC to DC converter 4 need only to respond to a 40db signal input. This is necessary if expansion over a wide range of 50–70db of program dynamic range is required. This is because the AC to DC converter usually has a dynamic range of 40db maximum, limited at low levels to the minimum conduction of the diodes and at the high level by saturation of the driving amplifier. For ordinary recorded signals having a 20–35db dynamic range, this refinement is not necessary, and as mentioned previously the range over which expansion is produced should, for best results, approximately match the input signal dynamic range.

FIG. 5 shows circuitry for part of the FIG. 1 embodiment of the invention where the AC to DC converter is desirably one of minimum cost. Also, the circuit of FIG. 5 adds an additional control circuit 5 to be described in parallel with the output of the AC to DC converter 4. The filter 3 comprises a high pass filter including a series capacitor 9 and a resistor 10. The voltage across resistor 10 is coupled to the input of the AC to DC converter 4 which, as illustrated, includes an input amplifier 12. The output of the amplifier 12 is coupled to a series coupling capacitor 13 which can help act to filter out low frequencies and a rectifier 15 arranged to clip negative going signals. A rectifier 14 arranged to pass positive signals is coupled between the juncture of capacitor 13 and rectifier 15 and a ripple filter capacitor 16. The ripple filter capacitor forms a relatively fast time constant circuit such as 50–200 milliseconds which responds relatively quickly to variations in dynamic range of the signal feed to the converter, but substantially filters out frequencies in excess of about 100–200 hertz.

The output across the capacitor 16 is coupled through a current-limiting resistor 17, which determines the degree of the effect of the output of the AC to DC converter 4 circuit on the variable gain stage 2 to the control input 6 of the variable gain stage 2, which may be a conventional integrated circuit transconductance operational amplifier designed to form a variable gain amplifier where the value of the positive current flowing into its control terminal 6 controls the gain thereof, a more positive signal producing a greater gain than a less positive signal.

The said added control circuit 5 in parallel with the output of the AC to DC converter is a relatively long time constant circuit which generates a DC control signal which is indicative of slow or average variations in dynamic range of the audio signal in contrast to capacitor 16 which responds fairly quickly to changing amplitudes of the input signal. This added control circuit includes a resistor 18 and isolation diode 22 and a capacitor 19 coupled in parallel with the filter capacitor 16. The control signal developed across the capacitor 19 is coupled to a current limiting resistor 20, in turn, connected to the input control terminal 6 of the variable gain stage 2. Since, as mentioned, the control terminal 6 of variable gain stage 2 is current operated it represents a low impedance which allows the currents through resistors 12 and 20 to independently or in sum control the gain.

The effect of this addition is such that for short duration transient signals, i.e. under about 100 milliseconds duration, the charge time of resistor 18 and capacitor 19 does not produce a voltage which would add to the fast acting control DC voltage. However, if the duration of the signal is larger than this charge time, an additional DC component is produced. The sum of these DC control signals produce control currents which act so that the gain characteristic responds quickly at first, and then more slowly to increase in the AC signal. For decreases in the AC signal the response depends on the prior signal duration. If the signal is a transient of short duration, the decay time is fast. If the signal is of such a duration that the capacitor 19 is fully charged, upon termination of the signal the DC control signal coupled through resistor 17 will decay quickly for the first portion of its action controlled by the fast discharge of capacitor 16 and then the DC control signal coupled through resistor 20 will decay more slowly as controlled by the discharge of capacitor 19. This two step decay characteristic avoids chopping effects on certain rhythm patterns while allowing for maximum expansion.

To provide a minimum gain on the variable gain stage 2, a resistor 21 is connected between the control input 6 of the variable gain stage 2 and a source of B+ voltage.

Typical values of the various impedance elements shown in FIG. 5 may be as follows:

| High pass filter capacitor 9 | — .0056 microfarads |
|---|---|
| High pass filter resistor 10 | — 15K ohms |
| Coupling capacitor 13 | — 0.1 microfarads |
| Ripple filter capacitor 16 | — 0.12 microfarads |
| Current limiting resistor 17 | — 100K ohms |
| Charging resistor 18 | — 47K ohms |
| Capacitor 19 | — 1.0 microfarads |
| Current limiting resistor 20 | — 100K ohms |
| Minimum gain setting resistor 21 | — 220K ohms |

FIG. 6 shown a variation of the circuitry of FIG. 5. The AC high pass filter of FIG. 5 is replaced with a band pass filter 3' consisting of inductors 24 and 25 and capacitors 23 and 26. In limiting the bandwidth of the signal fed to the AC to DC converter to that frequency range containing mostly harmonics of the fundamental frequency of the program signal, it should be recognized that these harmonic frequencies do not extend upward beyond approximately 15 kilohertz and that this represents the upper limit of most reproducing systems. However, there is little energy content in these harmonics above about 5 kilohertz. Additionally, as a result of multiplexing techniques for stereo transmission there may be substantial high frequency components present in some signals which do not directly relate to the program signals. The 19 kilohertz stereo pilot signal is an example. It is thus advantageous to limit the upper frequency which is converted to the DC control signal to insure that extraneous signals do not contribute to the DC output. Thus, the band pass filter preferably has the response shown in FIG. 7 where the response is substantially reduced (i.e., preferably reduced by at least about 6 db) only below about 1–2 kilohertz and only above about 5–8 kilohertz where there is little energy content in the audio signal program harmonics. The rate of attenuation for the higher frequencies need not be as fast as the rate for the lower frequencies, as indicated by the different stages of the leading and trailing edges thereof.

Another addition to the basic circuit of FIG. 5 is a nonlinear circuit forming part of the ripple filter integrator of the AC to DC converter circuit 4, further to reduce the AC ripple at the lower frequencies. This consists of diode 28, resistor 27 and capacitor 29. Resistor 27 and capacitor 29 form an additional stage of filtering which takes an undesirably long time to charge. Diode 28 allows the capacitor 29 to charge quickly for a positive going signal. The discharge path is through resistors 27 and 32. This results in a fast attack time with greater filtering action. Transistor 30 is connected in an emitter-follower configuration to isolate the load circuit elements comprising resistors 17, 18, 20 and capacitor 19. This allows capacitor 29 to be a smaller value for faster charging through diode 28. Thus, under conditions when maximum expansion has occurred and capacitors 29 and 19 are fully charged, if the input signal is suddenly removed, the expander gain drops quickly to a nominal value and then more slowly to its minimum value. Thus, any background noise which would be noticeable under the high gain of full expansion is quickly and unnoticeably removed while the balance of the return to minimum gain is achieved more slowly so as not to remove the effect of decaying ambiance sounds. Due to the isolation of transistor 30, the fast decay determined by capacitors 16 and 29 can be adjusted independently of the slow decay as determined by capacitor 19. Transistor 30 also supplies the charge current for capacitor 19. A diode may be used to isolate instead of transistor 30. However, the charge current for capacitor 19 must then be supplied by the AC to DC converter. A similar two step effect occurs in the charge of the two capacitors. The gain of the variable gain stage is first rapidly raised by the fast charge time constant associated with circuit capacitor 29. If the signal duration is such as to charge the longer time constant circuit associated with capacitor 19, an additional gain control signal is applied to the gain control terminal so as to supply an additional degree of gain. FIG. 8 shows the results of the fast and slow time constant capacitor circuits described on the resultant central currents fed through the central terminal of the variable gain stage 2 when a long duration momentary audio signal is suddenly applied and is suddenly terminated. While AC to DC converters have heretofore been used in different environments of the prior art using fast and slow time constants in units (e.g. see automatic gain control circuit of U.S. Pat. No. 3,790,896), the results of the actions of the time constant circuits are not independent either on attack or decay. The gain control action is not the sum of the action of the fast and slow time constants because the voltages do not add as do the control currents of the present invention.

Examples of parameter values for the ripple filter are:

| Resistor 31 | — | 10K ohms |
|---|---|---|
| Capacitor 16 | — | 0.2 microfarads |
| Capacitor 29 | — | .1 microfarads |
| Resistor 32 | — | 200K ohms |
| Resistor 27 | — | 200K ohms |

FIG. 9 illustrates the present invention applied to a variable gain stage 2 comprising a light emitting diode 34 space coupled to a light controlled resistor, such as photocell 32. The photocell 32, which acts as a variable resistor, is coupled between the audio signal source 1 and a resistor 33 connected to ground to form a voltage divider circuit. Thus, expansion of the audio input signal is achieved by the fact that an increased output of the light emitting diode increases the voltage fed from the output of stage 2 at the junction between photocell 32 and resistor 33. The aforesaid low frequency filter 3 is connected between audio signal source 1 and the input terminal 36 of the light emitting diode 34, and thus serves the same function as in the prior illustrated circuits. The light emitting diode is shown connected in series with a ground connected current limiting resistor 35. An amplifier, not shown, if desired can be used to match the current requirements of the light emitting diode 34. The resistor 37 connected to a source of positive potential sets a minimum current through the light emitting diode to set a given attenuation. An increase in the output signal of the low frequency filter 3 will cause an increase in brightness of the light emitting diode 3 which lowers the resistance of photo cell 32, thus increasing the output signal. The decay characteristic of this circuit will be that of the photo cell which can be selected to have a relatively slow decay. More precise control of the attack and decay can be achieved by using a fast response photo cell and including an AC to DC converter circuit and the two-step decay time constants after the filter, as shown in FIG. 6. This will also minimize distortion.

It should be understood that the present invention has provided a number of unique forms of noise reduction circuits which greatly improve high fidelity receiver systems. Numerous modifications may be made in these preferred forms of the invention without deviating from the broader aspects thereof.

I claim:

1. A noise reduction and expander circuit for uncompressed and randomly compressed audio signals encompassing the low, middle and upper frequency range, said main circuit comprising: main audio signal input terminal means at which said audio signals are applied, audio signal level varying means forming part of an expander circuit and having input terminal means coupled to said main audio signal input terminal means, control terminal means and output terminal means, the signal level varying means providing an output signal level at said output terminal means which signal varies in response to the magnitude of a control signal fed to said control terminal means, said signal level varying means being substantially non-frequency selective over the useful audio range for all operative levels of the control signal fed thereof, and control means for generating and feeding a control signal to said control terminal means of said signal level varying means and including means including filter means coupled to a source of said audio signal encompassing said low, middle and upper frequencies for passing the higher audio signal frequencies above said low frequencies which higher frequencies contain appreciable energy content of the harmonics of the audio signal and for eliminating or substantially reducing the low frequencies fed thereto and effecting the coupling to said control terminal means of a control signal resulting from the signal passed by said filter means, which control signal expands the audio signal fed to the input terminal means of said signal level varying means in proportion to the amplitude of the resultant signal passed by said filter means.

2. The noise reduction and expander circuit of claim 1 wherein said control means includes and AC to DC converter means having input terminal means and output terminal means, said AC to DC converter means generating at the latter output terminal means a DC signal proportional to the amplitude of the AC signal fed to the latter input terminal means thereof, said input terminal means of said AC to DC converter means being coupled to the output of said filter means, and means coupling the DC output of said AC to DC converter means to said control terminal means of said signal level varying means.

3. The noise reduction and expander circuit of claim 1 wherein said signal level varying means and said control means form a signal expanding system which for each 10db of dynamic range of the signal fed to said main audio signal input terminal means results in an expansion in dynamic range of the output signal of from about 2 to 6 db.

4. The noise reduction and expander circuit of claim 1 wherein said filter means is a band pass filter which substantially reduces frequencies below about 1 to 1.5 kilohertz and substantially reduces or eliminates from the output thereof frequencies above that containing appreciable harmonic energy of the audio signal.

5. The noise reduction and expander circuit of claim 2 wherein said AC to DC converter means includes rectifier means for rectifying the AC input thereof and ripple filter means of short time constant so the output of the AC to DC converter responds relatively quickly to the variations in dynamic range of the signal fed thereto.

6. The noise reduction and expander circuit of claim 2 wherein said AC to DC converter means includes a relatively fast acting short time constant filter circuit which provides a DC voltage output which follows the variation in dynamic range of the signals fed to the input terminal means of said converter but eliminates the cycle by cycle variations thereof.

7. The noise reduction and expander circuit of claim 6 wherein there is provided a relatively slow acting, longer time constant filter circuit responsive to the audio signal for coupling to the control terminal means of said signal level varying means a second DC control signal.

8. The noise reduction and expander circuit of claim 1 wherein there is coupled between said source of audio signals and said control terminal means of said signal level varying means a circuit which compresses the signal fed thereto.

9. The noise reduction and expander circuit of claim 1 combined with a source of uncompressed or randomly compressed audio signals.

10. The noise reduction and expander circuit of claim 1 wherein said filter means substantially reduces most of the signal frequencies below about 1 to 1.5 kilohertz.

11. The noise reduction and expander circuit of claim 10 wherein said filter means passes frequencies without significant amplitude reduction at and above about 1 to 1.5 kilohertz to a frequency of at least about 5–8 kilohertz.

12. The noise reduction and expander circuit of claim 2 wherein said AC to DC converter includes a relatively fast time constant DC voltage filter circuit which responds relatively quickly to an increase or decrease in dynamic level of the signals fed to the input terminal means of said converter but eliminates the cycle by cycle variations thereof, means coupling the output of said filter circuit to said control terminal means of said signal level varying means, and there is provided a relatively slow acting longer time constant filter circuit responsive to the output of said relatively fast time constant DC filter circuit by coupling to the control terminal means of said signal level varying means a second DC signal which responds relatively slowly to changes in the input thereto and adds its effect to the control of the output of said signal level varying means.

13. The noise reduction and expander circuit of claim 12 wherein there is provided between said fast acting short time constant filter circuit of said AC to DC converter and said relatively slow acting longer time constant filter circuit an emitter-follower type isolating circuit which has an output which follows the output of said fast acting short time constant filter circuit and feeds the input of said longer time constant filter circuit.

14. The noise reduction circuit of claim 7 wherein said longer time constant filter circuit is responsive to the output of said relatively fast acting short time constant filter circuit, and the outputs of the relatively fast acting short time constant filter circuit and the relatively slow acting longer time constant filter circuit are each independent in controlling the output of said signal level varying means whose resultant output is the sum of the effects of each of the outputs of said filter circuits.

15. The noise reduction and expander circuit of claim 2 where the dynamic range of said control signal is approximately matched to the dynamic range of the input signal so as to act only over a predetermined range of input signal change level.

16. The noise reduction and expander circuit of claim 3 where the dynamic range of the control signal is limited to about 25db and the resulting total expansion is from about 5 to 15 db.

17. The noise reduction and expander circuit of claim 2 wherein there is associated with said AC to DC converter means relatively fast and relatively slow time constant DC voltage producing filter circuit means which respectively respond relatively quickly and slowly to an increase or decrease in dynamic level of the signals fed to the input terminal means of said converter means, and coupling means for coupling the outputs of said filter circuit means to said control terminal means of said signal level varying means so the outputs thereof to a substantial degree have their individual effects upon the control of the output of said signal level varying means.

18. The noise reduction and expander circuit of claim 2 wherein there is associated with said AC to DC converter means two DC output producing filter circuits responsive to the change in dynamic range of the AC signal input to the AC to DC converter means, one of said filter circuits having fast charging and discharging capacitor charge and discharge circuits and the other of said filter circuits having relatively slow charging and discharging capacitor charge and discharge circuits, and coupling means for coupling the DC outputs of said filter circuits to said control terminal means of said signal level varying means so the outputs thereof to a substantial degree have their individual effects upon the control of the output of said signal level varying means.

* * * * *